US007099160B1

(12) United States Patent
Ice

(10) Patent No.: US 7,099,160 B1
(45) Date of Patent: Aug. 29, 2006

(54) CARD GUIDE SYSTEMS AND DEVICES

(75) Inventor: Donald A. Ice, Milpitas, CA (US)

(73) Assignee: Finisar Corporation, Sunnyvale, CA (US)

( * ) Notice: Subject to any disclaimer, the term of this patent is extended or adjusted under 35 U.S.C. 154(b) by 94 days.

(21) Appl. No.: 10/698,329

(22) Filed: Oct. 31, 2003

Related U.S. Application Data

(60) Provisional application No. 60/422,611, filed on Oct. 31, 2002.

(51) Int. Cl.
 *H04K 7/14* (2006.01)
(52) U.S. Cl. .................. 361/802; 361/741; 361/756; 211/41.17
(58) Field of Classification Search ............ 361/756, 361/802, 741, 796; 211/41.17
 See application file for complete search history.

(56) References Cited

U.S. PATENT DOCUMENTS

| 4,327,835 | A | * | 5/1982 | Leger ................. 211/41.17 |
| 5,666,271 | A | * | 9/1997 | Kim et al. ............ 361/726 |
| 5,912,799 | A | * | 6/1999 | Grouell et al. ........ 361/685 |
| 6,038,126 | A | * | 3/2000 | Weng ................. 361/679 |
| 6,166,917 | A | * | 12/2000 | Anderson ............ 361/756 |
| 6,195,262 | B1 | * | 2/2001 | Bodette et al. ........ 361/752 |
| 6,198,633 | B1 | * | 3/2001 | Lehman et al. ........ 361/756 |
| 6,205,033 | B1 | * | 3/2001 | Kelemen ............. 361/802 |
| 6,385,053 | B1 | | 5/2002 | Parizi et al. |
| 6,466,449 | B1 | | 10/2002 | Sheen et al. |
| 6,580,616 | B1 | | 6/2003 | Greenside et al. |
| 6,771,513 | B1 | * | 8/2004 | LaMothe et al. ....... 361/752 |
| 6,999,319 | B1 | * | 2/2006 | Wu et al. ............ 361/724 |
| 2004/0031767 | A1 | * | 2/2004 | Ice .................. 211/26 |
| 2004/0032714 | A1 | * | 2/2004 | Ice .................. 361/686 |
| 2004/0032715 | A1 | * | 2/2004 | Ice .................. 361/686 |
| 2004/0037054 | A1 | * | 2/2004 | Ice .................. 361/752 |
| 2004/0212973 | A1 | * | 10/2004 | Ice .................. 361/796 |
| 2005/0135077 | A1 | * | 6/2005 | Ice .................. 361/816 |

OTHER PUBLICATIONS

Documentation entitled "Self-Clinching Cable Tie-Mount", copyright 2001 by PEM Fastening Systems, a PennEngineering company.

* cited by examiner

*Primary Examiner*—Kamand Cuneo
*Assistant Examiner*—Dameon E. Levi
(74) *Attorney, Agent, or Firm*—Workman Nydegger

(57) ABSTRACT

A card guide is provided that is suitable for use in connection with a card cage system of an electronic equipment enclosure. The card guide includes one or more engagement elements configured to interact with corresponding structure of the chassis of the electronic equipment enclosure so that the card guide lacks any degree of freedom when the card guide is positioned within a fully assembled electronic equipment enclosure. At least one of the engagement elements is configured and arranged to enage the corresponding structure of the chassis in a permanent snap-fit type arrangement.

19 Claims, 6 Drawing Sheets

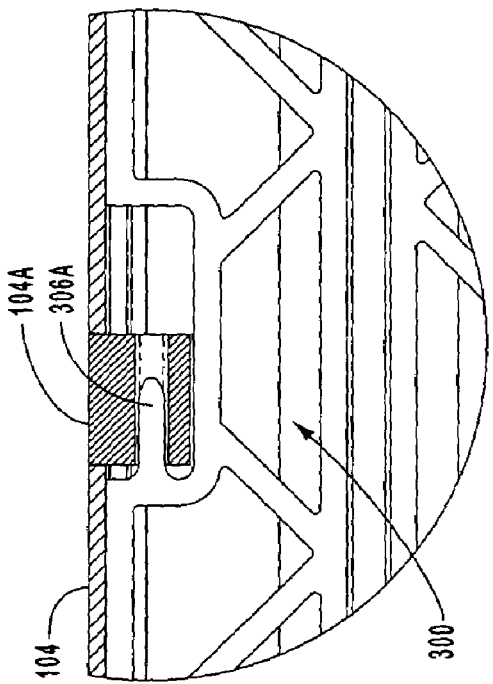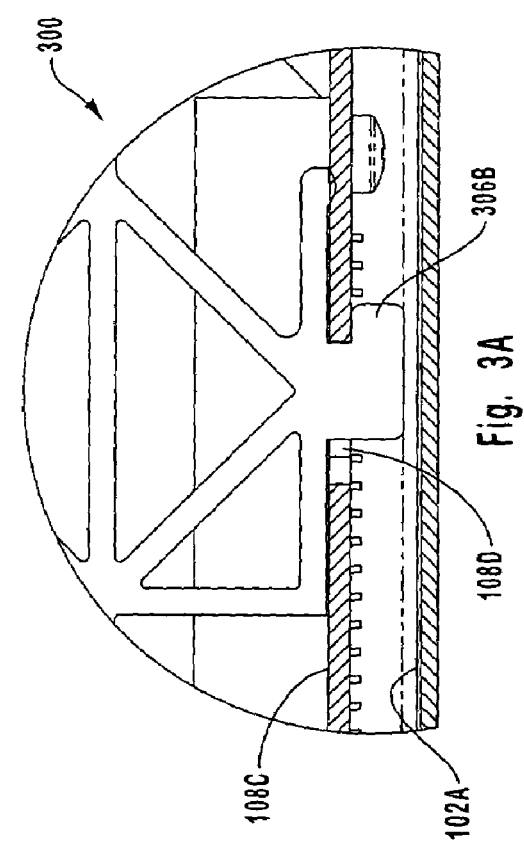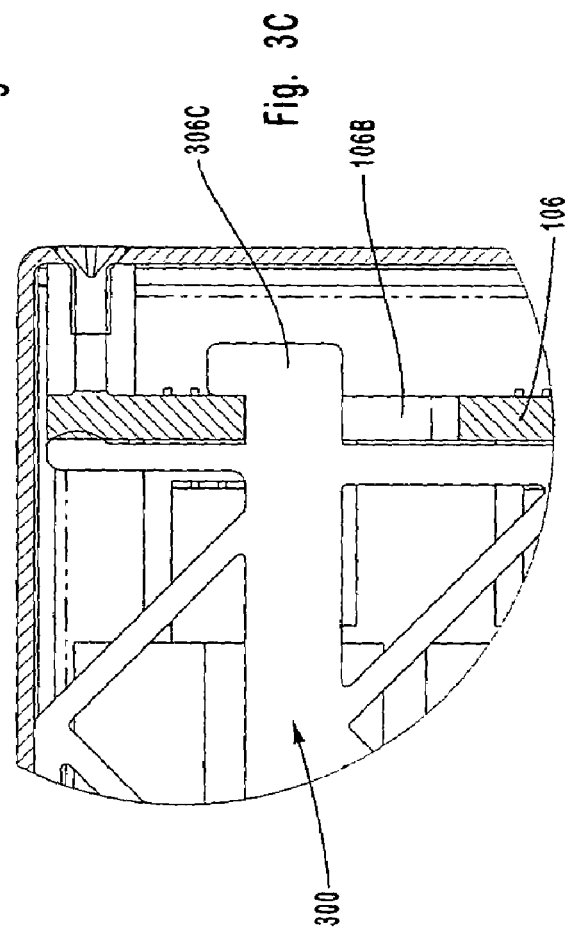

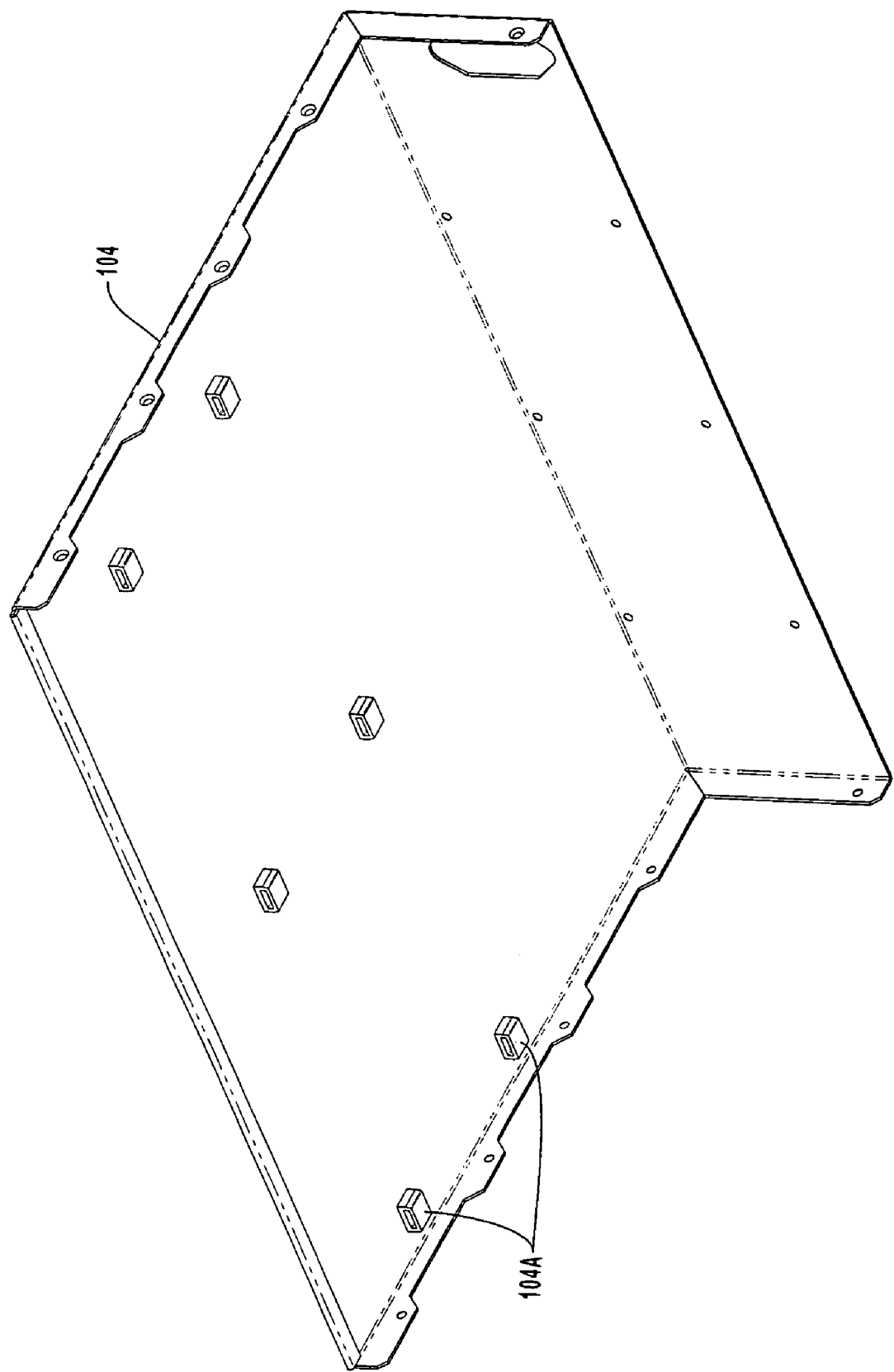

CARD GUIDE SYSTEMS AND DEVICES

CROSS-REFERENCE TO RELATED APPLICATIONS

This application claims the benefit of: U.S. Provisional Patent Application Ser. No. 60/422,611, entitled CARD GUIDE, filed on Oct. 31, 2002; and, U.S. patent application Ser. No. 10/638,981, entitled CARD CAGE SYSTEM, filed on Aug. 12, 2003, both of which are incorporated herein in their respective entireties by this reference.

BACKGROUND

1. Technological Field

This invention is generally concerned with electronic equipment racks and related systems and devices. More specifically, embodiments of the present invention relate to card guides and card guide systems for removably retaining electronic modules within an electronic equipment rack.

2. Related Technology

Electronic equipment enclosures are used in a number of different industries and applications and generally serve to receive one or more pieces of electronic equipment and devices in such a way that the individual electronic components can operably interact with each other and/or with the electronic equipment enclosure. In some instances, such electronic equipment enclosures are configured to permit the use of one or more "plug-in" functional modules that electrically and mechanically interface with the electronic equipment enclosure and/or with other functional modules.

More specifically, many electronic equipment enclosures include a chassis within which is disposed an internal structure configured to removably receive one or more functional modules in a desired arrangement. Such internal structures are often referred to as "card cages." The card cage is configured so that a user can define the functionality of the electronic equipment enclosure by selecting particular functional modules to be employed in the electronic equipment enclosure. In the event that it is desired to modify the functionality of a particular electronic equipment enclosure, such changes can be made simply by positioning additional functional modules in the card cage of the electronic equipment enclosure and/or by removing selected functional modules from the card cage of the electronic equipment enclosure.

Although card cages and their constituent elements enhance the flexibility and functionality of the associated electronic equipment enclosure, various problems nonetheless remain with conventional card cage systems, and especially card guides. Some exemplary problems relate to the fact that conventional card guides are typically retained in position within the chassis through the use of fasteners such as screws, pins, or bolts.

In particular, each card guide may require several fasteners in order to ensure that the card guide is securely positioned within the chassis. Moreover, because the card guide must be connected to different parts of the chassis structure, various types and sizes of fasteners may be required to install a single card guide. Thus, conventional card guides and related systems are often quite complicated and time-consuming to install. This aspect, at least, of conventional card cage systems tends to detract from the flexibility that the card cage otherwise lends to the electronic equipment rack, since the use of multiple and different fasteners makes it rather difficult to readily reconfigure the card cage should the need arise.

A related concern with conventional card guides relates to the fact that the use of multiple fasteners to attach a card guide to the chassis necessarily requires that the card guide and the chassis each define complementary screw holes or similar openings into which the fastener must be inserted. This arrangement is problematic at least because it is often difficult to ensure that the various screw holes of the card guide and chassis are properly aligned for assembly. This problem is aggravated by the fact, noted earlier herein, that each card guide typically requires multiple fasteners for installation. Thus, the configuration and arrangement of typical card guides tends to complicate and impair the installation of the card guide in the chassis.

Yet another problem with conventional card guides and related systems and devices is that, due to the structure and arrangement of the card guide and the associated chassis, it is not always possible to locate screw holes in the locations necessary to ensure proper and secure positioning of the card guide within the chassis, so that less than optimal locations must be selected. Thus, proper positioning of the card guide is compromised, resulting in an unstable and/or misaligned card guide that hampers ready insertion, alignment, and removal of cards. Further, inserted cards may not function properly if they are misaligned within the card cage.

In view of the foregoing discussion, what is needed are card cages and card guides that can be quickly and readily aligned, and securely installed, in an electronic equipment chassis without requiring the use of fasteners. Further, such card cages and card guides should be configured so that they reliably maintain their position within the chassis once installed.

BRIEF SUMMARY OF AN EXEMPLARY EMBODIMENT OF THE INVENTION

In general, embodiments of the invention are concerned with card cage components, such as card guides, that can be readily and securely positioned within an electronic equipment chassis without requiring the use of fasteners.

In one exemplary implementation, the card guide comprises an element of a multi-part locking arrangement. This exemplary card guide includes a plurality of integral engagement elements that are configured and arranged to releasably engage corresponding structure of an electronic equipment chassis. In at least some implementations, the integral engagement elements are engaged with the corresponding structure of the electronic equipment chassis by snapping or pushing the engagement element into engagement with the corresponding structure.

In this way, embodiments of the invention enable ready and reliable installation and positioning of the card guide within the electronic equipment chassis. Further, embodiments of the invention are relatively simple to position and install since no fasteners are required for installation. These, and other, aspects of exemplary embodiments of the invention will become more fully apparent from the following description and appended claims.

BRIEF DESCRIPTION OF THE DRAWINGS

In order that the manner in which the above-recited and other advantages and features of the invention are obtained, a more particular description of the invention briefly described above will be rendered by reference to specific embodiments thereof which are illustrated in the appended drawings. Understanding that these drawings depict only exemplary embodiments of the invention and are not therefore to be considered limiting of its scope, the invention will be described and explained with additional specificity and detail through the use of the accompanying drawings in which:

FIG. 3A is a detail taken from FIG. 3 and illustrating aspects of the relation between the bottom portion of an exemplary card guide and an electronic equipment chassis;

FIG. 3B is a detail taken from FIG. 3 and illustrating aspects of the relation between the top portion of an exemplary card guide and an electronic equipment chassis;

FIG. 3C is a detail taken from FIG. 3 and illustrating aspects of the relation between the rear portion of an exemplary card guide and an electronic equipment chassis;

FIG. 5 a perspective view illustrating further aspects of corresponding structure of the bottom and rear portions of an electronic equipment chassis.

DETAILED DESCRIPTION OF EXEMPLARY EMBODIMENTS OF THE INVENTION

Reference will now be made to figures wherein like structures will be provided with like reference designations. It is to be understood that the drawings are diagrammatic and schematic representations of various embodiments of the claimed invention, and are not to be construed as limiting the scope of the present invention in any way, nor are the drawings necessarily drawn to scale.

Figure 1:
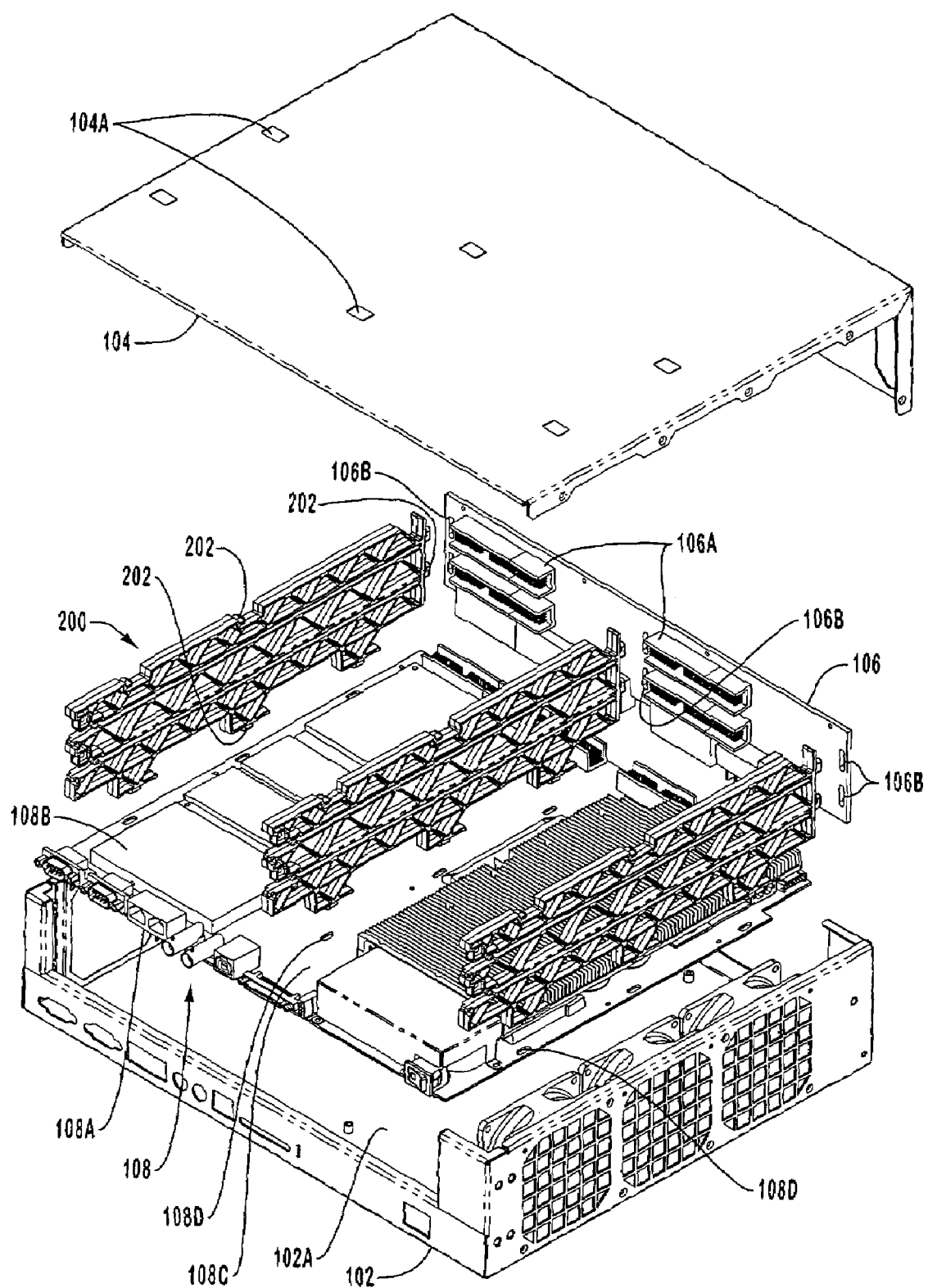
FIG. 1 is an exploded perspective view of an exemplary operating environment for embodiments of the invention.

With attention first to FIG. 1, details are provided concerning aspects of an exemplary operating environment for embodiments of the invention. In particular, an electronic equipment rack 100 is indicated that generally comprises a housing 102 having a floor 102A and being configured to be removably attached to a cover 104. A backplane 106 is interposed between the housing 102 and the cover 104 and includes connectors 106A that mechanically and electrically interface with functional modules 400 (see FIG. 3) positioned within the electronic equipment rack 100. It should be noted that the housing 102, cover 104 and backplane 106, or combinations thereof, may be collectively referred to herein as comprising an "electronic equipment chassis," or simply "chassis." The exemplary chassis arrangements disclosed herein should not be construed to limit the scope of the invention in any way.

A printed circuit board ("PCB") assembly 108 is positioned within the space collectively defined by the housing 102, cover 106 and backplane 106. As indicated in FIG. 1, exemplary PCB assemblies include various connectors 108A and circuitry 108B attached either directly or indirectly to a PCB 108C. Among other things, the PCB 108C defines various structural elements or configurations, such as openings 108D for example, configured and arranged to interact with a card guide 200, as discussed in further detail below. In similar fashion, the backplane 106 may likewise define, or otherwise include, various structural elements or configurations, such as openings 106B configured and arranged to interact with a card guide.

The cover 104 may also define such openings or, alternatively, may include engagement elements 104A configured and arranged to receive, or otherwise engage, portions of the card guide 200. The engagement elements 104A may be integral with the cover 104 or, alternatively, may comprise discrete structural elements connected to the cover 104.

In some cases, the floor 102A may likewise define, or otherwise include, various structural elements or configurations configured and arranged to interact with a card guide 200. Note that exemplary structural elements or configurations such as openings 106B and 108D, as well as engagement elements 104A, may be referred to herein, individual or collectively, as "corresponding structure" of an electronic equipment chassis.

With continuing attention to FIG. 1, one or more card guides 200 are further provided that act to removably receive one or more functional modules 400 (see FIG. 3) in various arrangements within the electronic equipment rack 100. In general, the card guides 200 are configured to be removably, or permanently in some cases, installed within the electronic equipment rack without necessitating the use of fasteners to effect and maintain such installation. Accordingly, exemplary embodiments of card guides 200 may be referred to herein as comprising a "fastenerless" construction. To this end, the card guides 200 generally include one or more engagement elements 202 positioned at various locations on the card guide 200 and configured and arranged to removably engage, or otherwise interact with, the corresponding structure of the chassis.

As discussed elsewhere herein, exemplary implementations of the engagement elements 202, or equivalent structure, and the corresponding structure of the chassis may be collectively referred to herein as a "fastenerless connection system." With respect to the fastenerless connection system and the engagement elements, it should further be noted that, in some implementations of the invention, an arrangement conceptually the reverse of that illustrated in FIG. 1, for example, is implemented.

In particular, in such alternative implementations, the engagement elements comprise a portion of the chassis instead of the card guide 200 while, on the other hand, the card guides 200 define various structural elements or configurations analogous to, for example, engagement elements 104A and/or openings 106B. In similar fashion, the PCB 108 may be designed to include structural elements that are configured to be received within an opening defined by the card guide 200. Accordingly, the scope of the invention should not be construed to be limited to the disclosed exemplary embodiments. Further details concerning the card guides 200, as well as engagement elements 202 and their interaction with the chassis, are provided below in connection with the discussion of FIGS. 2 through 5.

As suggested by the foregoing, various structural configurations and arrangements may be effectively employed in implementing the fastenerless connection of the card guide 200 to the chassis. Accordingly, the engagement elements 202 comprise but one exemplary structural implementation of a means for implementing a fastenerless connection. Any other structural configuration and arrangement of comparable functionality may likewise be employed however, and the scope of the invention should not be construed to be limited to the exemplary implementations disclosed herein.

Further, where openings, such as 106B and 108D, are defined and intended to receive engagement elements of the card guide, such openings are configured to present an adequate "target" so that an assembly can readily engage the opening with the engagement element, notwithstanding some initial misalignment between the two. Correspondingly, exemplary embodiments of the engagement elements are relatively smaller than the openings and are configured with rounded edges and/or other structural features designed to reduce the likelihood of the engagement element sticking or binding with the opening during installation of the card guide. For example, one exemplary engagement element 306B (see, e.g., FIG. 3) may include a tapered upper portion that can be readily aligned with, inserted in, engagement structure 104A of the cover 104. Other structural features of comparable functionality may likewise be employed.

Figure 2:
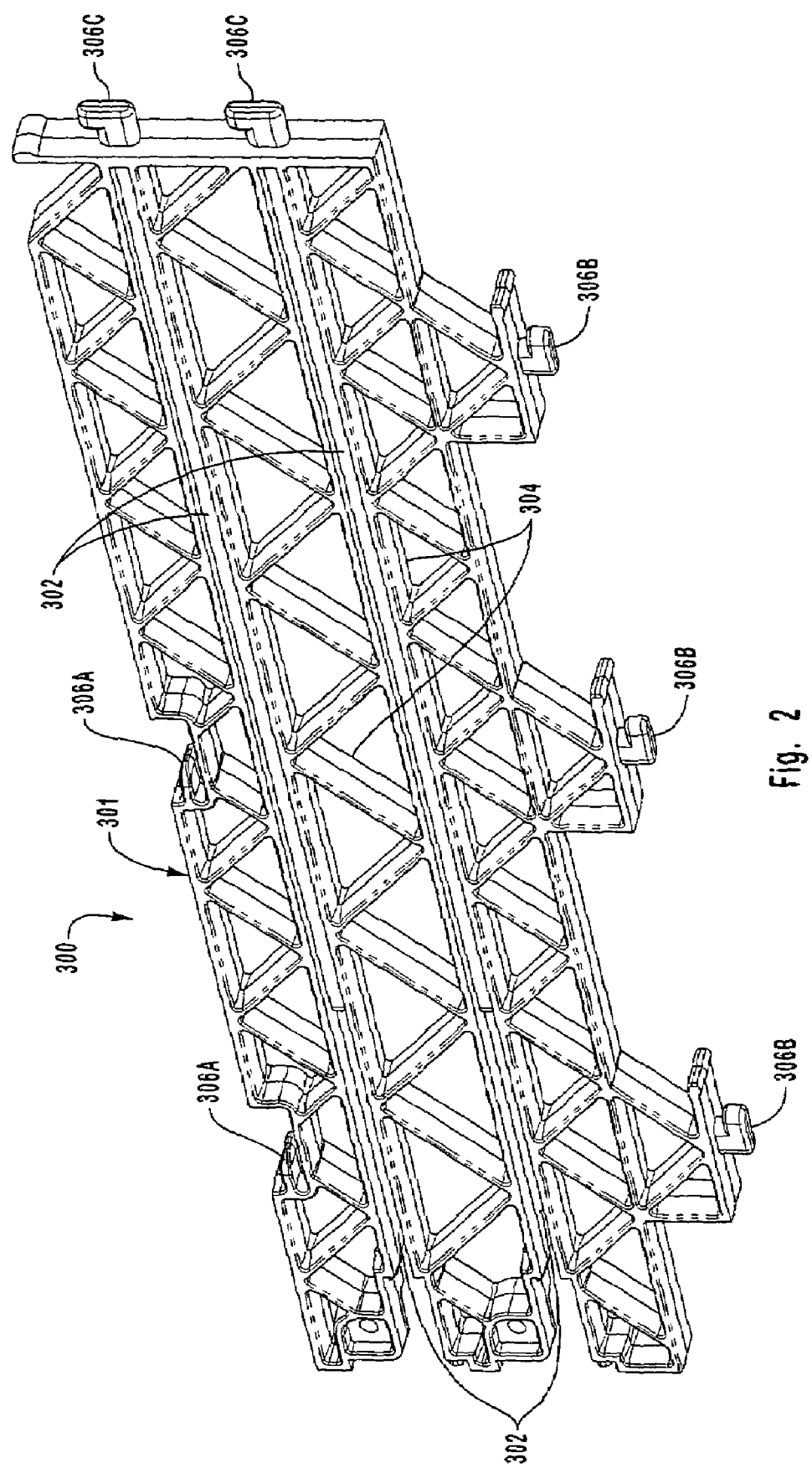
FIG. 2 is a detailed perspective view of an exemplary implementation of a card guide.

Directing attention now to FIG. 2, further details are provided concerning an exemplary implementation of a card guide, denoted generally at 300. Exemplary card guides 300 may be constructed of a wide variety of materials such as, but not limited to, injection-molded polycarbonate materials such as Lexan®, or a carbon-fiber/polytetrafluoroethylene ("PTFE"), where the PTFE exemplarily comprises Teflon® material. Any other suitable materials, such as various types of plastics, may be employed however. In at least some implementations, the card guides 300 are flame retardant and are constructed, configured and/or arranged to facilitate dissipation of charge buildups such as may contribute to static electricity-related problems.

Generally, two or more card guides 300 are disposed within the electronic equipment rack 100 so as to enable various arrangements of functional modules. Some card guide implementations are further configured to operably interact with a removable adapter element (not shown) that lends a further degree of flexibility to card cage systems that include card guides 300 by allowing functional modules of various widths to be positioned within the electronic equipment rack 100. More particularly, by selectively removing, and/or retaining, one or more adapter elements from the card cage, a user can quickly and easily customize the card guides to accommodate different combinations and arrangements of cards of various sizes. Further, the number of card guides 300 employed in any particular situation may be varied as necessary to suit the requirements of a desired arrangement of functional modules.

Each card guide 300 generally operates by restraining the engaged card of a functional module in two directions. First, the card is restrained from moving laterally in the direction of the width of the card. Second, the card is restrained from moving up or down in the direction perpendicular to the plane of the card. To do so, each card guide has at least one channel that is shaped to receive and engage a corresponding edge of the card.

Figure 3:
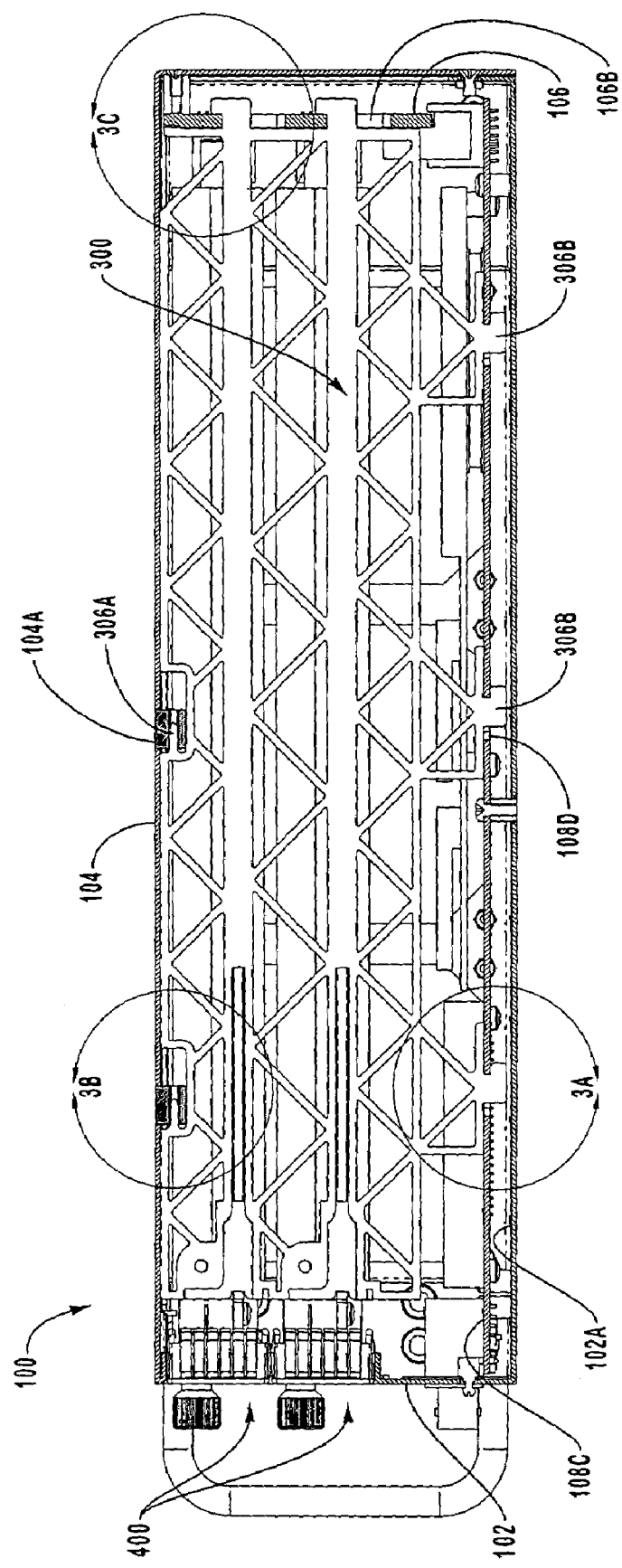
FIG. 3 is a side view illustrating an exemplary implementation of a card guide as installed in an electronic equipment chassis.

More particularly, the exemplary card guide 300 includes a body 301 that defines a channel 302 that runs substantially along the entire length of the card guide 300 and that is generally configured to slidingly receive a card edge. An end card guide typically include a channel 302 on one side only, while a middle card guide typically defines a channel 302 on either side so as to accommodate opposing edges of adjacent cards. As indicated in FIG. 3, the height of the card guide 300 may be varied depending upon the number of functional modules it is desired to stack within the electronic equipment rack 100. The particular illustrated embodiment includes two channels 302 separated by a web structure 304 that provides structural integrity to the system and that further restrains lateral motion of the card in the direction of the width of the card. The web structure 304 also insures sufficient clearance between two adjacent cards.

With more particular attention now to FIG. 2, further details are provided concerning the exemplary card guide 300. In particular, the card guide 300 includes, or otherwise defines, various engagement elements 306A, 306B and 306C configured and arranged to engage, or otherwise interact with, corresponding structure of the electronic equipment rack 100 (see FIG. 1) chassis. In at least some implementations, the engagement elements 306A, 306B and 306C are integral with the card guide 300.

Generally, the engagement elements 306A, 306B and 306C are configured and arranged to interact in a desired fashion with the chassis so as to enable the fastenerless connection of the card guide 300 to the electronic equipment rack 100. Thus, engagement elements 306 may be implemented in a wide variety of forms, configurations, and arrangements, depending upon the requirements of a particular application or operating environment. Further, the engagement elements 306 can be arranged on the card guide 300 so that a particular desired sequence of assembly is defined or implicated. Along the same lines, the engagement elements 306 can be configured and arranged on the card guide 300 so that incorrect installation of the card guide 300 and/or an improper card cage construction and installation sequence cannot be performed. Moreover, some implementations will admit of a number of different cage construction and installation sequences. Consistent with the foregoing, the scope of the invention is not limited to any particular type, configuration or arrangement of engagement elements. Rather, the disclosed embodiments are exemplary only Among other things then, implementations of the engagement elements 306 serve to reduce, or eliminate, the various degrees of freedom of the card guide, relative to the chassis, and thereby allows the card guides 300 to be permanently, in some implementations at least, and securely interlocked with the chassis. Such an arrangement is useful where, for example, it is not possible, or desirable, to attach the card guides 300 to the chassis by using fasteners such as screws or bolts.

Figure 4:
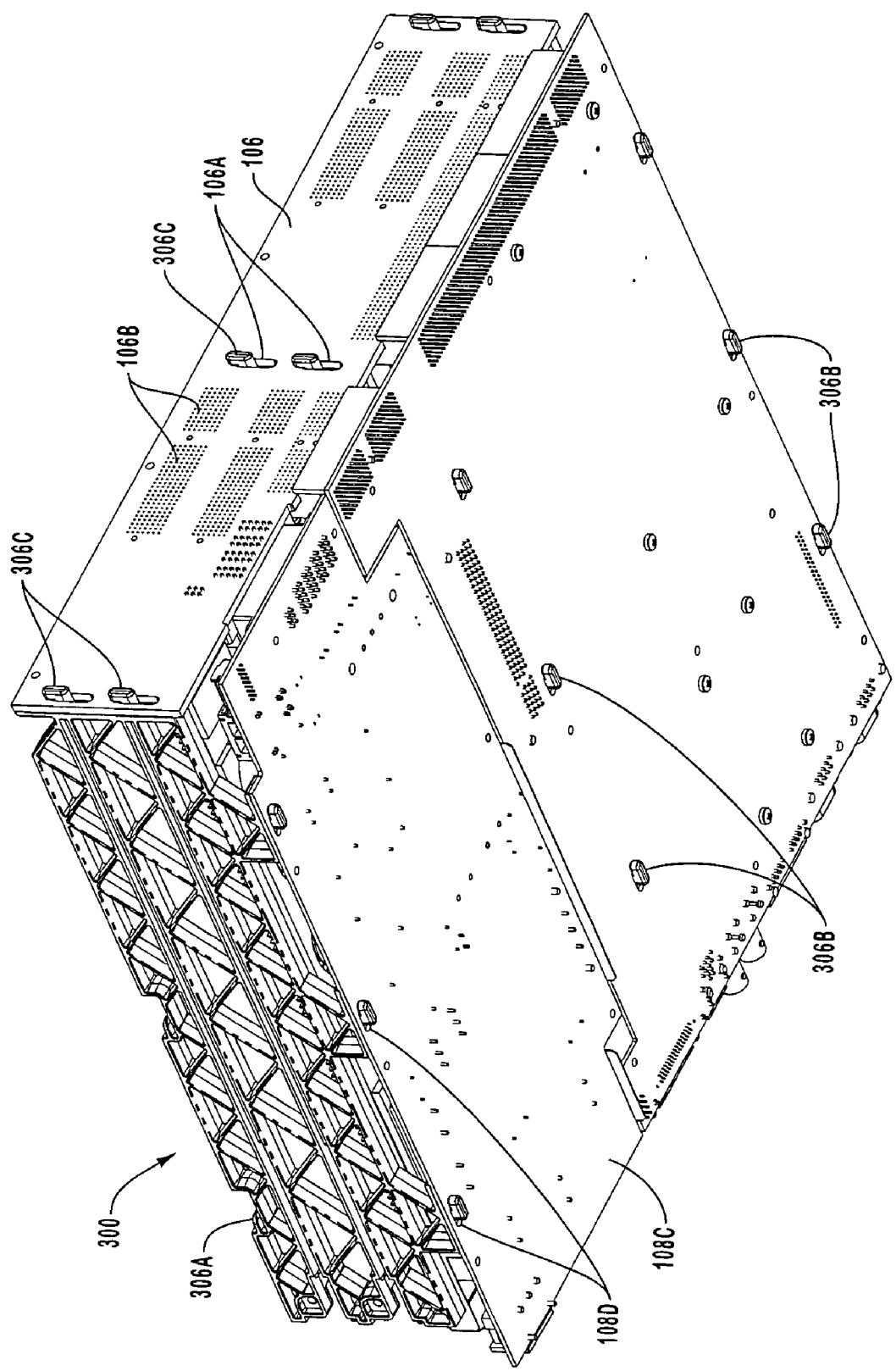
FIG. 4 is a perspective view illustrating further aspects of the interaction and relation between an exemplary card guide and corresponding structure of the bottom and rear portions of an electronic equipment chassis.

Directing attention now to FIGS. 3 through 5, additional details are provided concerning aspects of the relation and interaction between exemplary implementations of the engagement elements 306 of card guide 300 with the chassis elements of the electronic equipment rack 100. As indicated in FIG. 3, the configuration and arrangement of each of the exemplary engagement elements 306 corresponds to the intended function of the engagement element and its relation to the chassis.

For example, an exemplary implementation of engagement element 306B, illustrated in FIGS. 3 and 3A, generally comprises a foot-shaped configuration designed and arranged to slidingly engage, and be retained in, the opening 108D defined by the PCB 108. Depending upon the particular implementation, the opening 108D may be designed so that the engagement element 306B can only be inserted if tilted. Alternatively, the opening 108D may be designed to enable the engagement element 306B to be simply dropped in and slid into the position indicated in FIGS. 3 and 3A. Thus, as suggested in FIGS. 3 and 3A, each of the card guides 300 is first attached to the PCB 108 by engaging the engagement element 306B of the card guide 300 with the corresponding opening 108D defined by the PCB 108 and advancing the card guide 300 until each engagement element 306B reaches the end of the corresponding slot opening 108D, as shown.

With particular attention now to FIG. 3B, and with continuing attention to FIG. 3, the engagement element 306A comprises a generally tongue-shaped configuration arranged to be slidingly received within, and securely retained by, a corresponding engagement structure 104A.

Exemplarily, the engagement element 306B is received within engagement structure 104A illustrated in FIGS. 1 and 5, in a snap-fit arrangement. One exemplary implementation of such an engagement structure 104A is the type "D" self-clinching tie mount, model number TD-175-12, produced by PEM® Fastening Systems. However, any other structural device or configuration of comparable functionality may alternatively be employed. Such structural devices and configurations may be referred to generally herein as a "self clinching tie mount."

Directing attention now to FIG. 3C, and with continuing attention to FIG. 3, the exemplary engagement element 306C comprises a foot-like configuration arranged to slidingly engage, and be retained in, the opening 106B defined by the backplane 106. Thus, openings 106B defined by the backplane 106 of the chassis receive the engagement elements 306C on the rear edge of the card guide 300 and the backplane 106 is, exemplarily, slid downwardly toward the PCB 108 until each openings 106B end contacts the engagement elements 306C of the corresponding card guide 300, as shown.

With attention to FIG. 4, and continuing attention to FIGS. 3 through 3C, further details are provided concerning the interaction of exemplary card guides 300 with elements of the chassis. Generally, FIG. 4 indicates an arrangement where three card guides 300 are engaged with the backplane 106 and housing 102 of the chassis. More specifically, in FIG. 4, the engagement elements 306B of the card guides 300 have been received and positioned in the corresponding openings 108D defined by the PCB 108. Further, the engagement elements 306C of the card guides 300 have been received and positioned in the corresponding openings 106A defined by the backplane 106. The installation is completed by attachment of the cover 104 (see e.g., FIG. 3), so that all degrees of freedom of the card guides 300 are eliminated, thereby resulting in the stable and secure positioning of the card guides 300.

As suggested above, and noted elsewhere herein, at least some implementations of the engagement elements 306 allow the card guide 300 to be removably attached to the chassis. Yet other implementations of the engagement elements 306, such as engagement element 306B for example, allow the card guide 300 to be permanently attached to the chassis. Moreover, exemplary embodiments of the card guide, such as card guide 300, may comprise a combination of engagement elements 306 where some engagement elements 306 are configured to permanently engage corresponding structure of the chassis, while other engagement elements 306 are configured to releasably engage corresponding structure of the chassis. Yet other embodiments of the card guide 300 comprise only releasably engaging engagement elements 306, or only permanently engaging engagement elements 306. Accordingly, the scope of the invention should not be construed to be limited to the exemplary card guide 300 and engagement element 306 implementations disclosed herein.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An electronic equipment rack for receiving a plurality of functional modules, each of which includes a corresponding card, the electronic equipment rack comprising:
   a chassis, comprising:
      a housing;
      a backplane attached to the housing; and
      a cover attached to the backplane and to the housing;
   a printed circuit board assembly substantially disposed within the chassis; and
   a plurality of card guides substantially disposed within the chassis in a spaced apart arrangement with respect to each other, each of the card guides being configured to interface with a card of a functional module, and each of the card guides including:
      a first engagement element that engages the printed circuit board assembly;
      a second engagement element that engages the backplane; and
      a third engagement element that engages the cover.

2. The electronic equipment rack as recited in claim 1, wherein the cover includes a self-clinching tie mount arranged to engage the third engagement element.

3. The electronic equipment rack as recited in claim 1, wherein adjacent card guides are disposed opposite each other at a distance generally corresponding to a width of a functional module card.

4. The electronic equipment rack as recited in claim 1, wherein each card guide is releasably engaged with the printed circuit board assembly, the backplane and the cover.

5. The electronic equipment rack as recited in claim 1, wherein the plurality of card guides collectively define a plurality of card storage levels.

6. The electronic equipment rack as recited in claim 1, wherein the plurality of card guides comprises first and second end card guides and a middle card guide, the first and second card guides being positioned on either side of the middle card guide such that:
   a distance between the middle card guide and the first end card guide generally corresponds to a width of a functional module card; and
   a distance between the middle card guide and the second end card guide generally corresponds to a width of a functional module card.

7. The electronic equipment rack as recited in claim 1, wherein the plurality of card guides collectively define at least two side-by-side card storage slots.

8. The electronic equipment rack as recited in claim 1, wherein the plurality of card guides collectively define at least two stacked card storage slots.

9. The electronic equipment rack as recited in claim 1, wherein the plurality of card guides collectively define:
   at least two stacked card storage slots; and
   at least two side-by-side card storage slots.

10. A connection system, comprising:
   a plurality of engagement elements, where:
      a first engagement element of the plurality comprises a portion of a printed circuit board assembly;
      a second engagement element of the plurality comprises a portion of a backplane of an electronic equipment chassis; and
      a third engagement element of the plurality comprises a portion of a cover of an electronic equipment chassis; and
   corresponding structure configured to engage the plurality of engagement elements in a fastenerless arrangement, the corresponding structure comprising a portion of one or more card guides, each of the card guides being configured to interface with a card of a functional module.

11. The fastenerless connection system as recited in claim 10, wherein a portion of the corresponding structure is configured to releasably engage an engagement element.

12. The fastenerless connection system as recited in claim 10, wherein a portion of the corresponding structure is configured to permanently engage an engagement element.

13. An electronic equipment rack configured to receive a plurality of functional modules, each of which includes a corresponding card, the electronic equipment rack comprising:
   a chassis, comprising:
      a housing;
      a backplane attached to the housing; and
      a cover attached to the backplane and to the housing;
   a plurality of self-clinching tie mounts attached to the cover;
   a printed circuit board assembly substantially disposed within the interior of the electronic equipment chassis; and
   a plurality of card guides disposed within the chassis in a spaced apart arrangement with respect to each other, each of the card guides engaged with a corresponding self-clinching tie mount.

14. The electronic equipment rack as recited in claim 13, wherein adjacent card guides are disposed opposite each other at a distance generally corresponding to a width of a functional module card.

15. The electronic equipment rack as recited in claim 13, wherein the plurality of card guides collectively define a plurality of card storage levels.

16. The electronic equipment rack as recited in claim 13, wherein the plurality of card guides comprises first and second end card guides and a middle card guide, the first and second card guides being positioned on either side of the middle card guide such that:
   a distance between the middle card guide and the first end card guide generally corresponds to a width of a functional module card; and
   a distance between the middle card guide and the second end card guide generally corresponds to a width of a functional module card.

17. The electronic equipment rack as recited in claim 13, wherein the plurality of card guides collectively define at least two side-by-side card storage slots.

18. The electronic equipment rack as recited in claim 13, wherein the plurality of card guides collectively define at least two stacked card storage slots.

19. The electronic equipment rack as recited in claim 13, wherein the plurality of card guides collectively define:
   at least two stacked card storage slots; and
   at least two side-by-side card storage slots.

* * * * *